United States Patent
Wang et al.

(10) Patent No.: US 12,008,263 B2
(45) Date of Patent: Jun. 11, 2024

(54) GARBAGE COLLECTION AND DATA STORAGE METHOD AND APPARATUS, AND STORAGE SYSTEM

(71) Applicant: HUAWEI TECHNOLOGIES CO., LTD., Shenzhen (CN)

(72) Inventors: Ying Wang, Beijing (CN); Xiaobao Zhao, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 574 days.

(21) Appl. No.: 17/183,657

(22) Filed: Feb. 24, 2021

(65) Prior Publication Data

US 2021/0181992 A1  Jun. 17, 2021

Related U.S. Application Data

(63) Continuation of application No. PCT/CN2019/098256, filed on Jul. 30, 2019.

(30) Foreign Application Priority Data

Aug. 27, 2018  (CN) .......................... 201810983555.0

(51) Int. Cl.
*G06F 3/06* (2006.01)
*G06F 11/14* (2006.01)
(Continued)

(52) U.S. Cl.
CPC .......... *G06F 3/0659* (2013.01); *G06F 3/0619* (2013.01); *G06F 3/0673* (2013.01);
(Continued)

(58) Field of Classification Search
CPC .... G06F 11/14; G06F 11/1469; G06F 3/0619; G06F 3/0673; G06F 3/0659
See application file for complete search history.

(56) References Cited

U.S. PATENT DOCUMENTS 6,526,448 B1 *  2/2003  Blewett ............... H04L 67/1001
                                                      709/239
8,316,176 B1 * 11/2012  Phan .................... G06F 12/0246
                                                      365/185.33
(Continued)

FOREIGN PATENT DOCUMENTS

CN        102667738 A       9/2012
CN        105045523 A      11/2015
(Continued)

OTHER PUBLICATIONS

Fang et al., "Whole process optimized garbage collection for solid-state drives", Journal of Computer Applications, 1001-9081(2017) 05-1257-06, May 10, 2017, total 7 pages including an English-language abstract.
(Continued)

*Primary Examiner* — Kamini B Patel
(74) *Attorney, Agent, or Firm* — Maier & Maier, PLLC

(57) ABSTRACT

A data storage method and apparatus, and a storage system are provided. The method is applied to a storage system. The storage system includes at least one first memory and a second memory. The at least one first memory includes a plurality of storage areas. Garbage collection is performed based on each of the plurality of storage areas. In the method, a time length between the earliest expiration time and the latest expiration time in expiration time of valid data stored in a target storage area is limited to be less than or equal to a preset time length, so that the expiration time of the valid data stored in the target storage area is comparatively centralized.

17 Claims, 5 Drawing Sheets

(51) Int. Cl.
  *G11B 20/12* (2006.01)
  *H03M 13/15* (2006.01)
(52) U.S. Cl.
  CPC ...... *G06F 11/1469* (2013.01); *G11B 20/1217* (2013.01); *H03M 13/154* (2013.01); *G06F 2201/82* (2013.01); *G11B 2020/1238* (2013.01); *G11B 2020/1292* (2013.01)

(56) References Cited

U.S. PATENT DOCUMENTS

| | | | |
|---|---|---|---|
| 10,496,293 B2* | 12/2019 | Goldberg | G06F 3/0619 |
| 2003/0084159 A1* | 5/2003 | Blewett | H04L 67/1001 |
| | | | 709/226 |
| 2009/0150641 A1* | 6/2009 | Flynn | G06F 3/0652 |
| | | | 711/202 |
| 2011/0202812 A1* | 8/2011 | Asano | G06F 11/1068 |
| | | | 714/747 |
| 2011/0258343 A1* | 10/2011 | Kettunen | H04L 61/5061 |
| | | | 709/245 |
| 2012/0030260 A1* | 2/2012 | Lu | G06F 11/1453 |
| | | | 707/820 |
| 2012/0246391 A1* | 9/2012 | Meir | G11C 16/349 |
| | | | 711/170 |
| 2014/0025875 A1* | 1/2014 | Wang | G06F 12/0246 |
| | | | 711/103 |
| 2015/0212938 A1* | 7/2015 | Chen | G06F 12/0253 |
| | | | 711/166 |
| 2015/0293713 A1 | 10/2015 | Seo et al. | |
| 2015/0347029 A1 | 12/2015 | Kotte et al. | |
| 2015/0358955 A1* | 12/2015 | Kresse | H04L 67/12 |
| | | | 370/329 |
| 2016/0062882 A1* | 3/2016 | Bonwick | G06F 3/0649 |
| | | | 711/165 |
| 2016/0132429 A1* | 5/2016 | Lin | G06F 3/0665 |
| | | | 707/814 |
| 2016/0188227 A1 | 6/2016 | Yang et al. | |
| 2016/0239380 A1* | 8/2016 | Wideman | H03M 13/373 |
| 2016/0299715 A1* | 10/2016 | Hashimoto | G06F 3/0652 |
| 2017/0032012 A1* | 2/2017 | Zhang | G06F 16/1748 |
| 2017/0083438 A1* | 3/2017 | Han | G06F 3/0676 |
| 2017/0153842 A1* | 6/2017 | Iwabuchi | G06F 3/0676 |
| 2017/0242752 A1 | 8/2017 | Lee | |
| 2017/0286288 A1* | 10/2017 | Higgins | G06F 12/0246 |
| 2017/0364264 A1* | 12/2017 | Ioannou | G06F 3/061 |
| 2018/0060230 A1* | 3/2018 | Kankani | G06F 12/0246 |
| 2018/0107593 A1 | 4/2018 | Ogawa | |
| 2018/0196745 A1* | 7/2018 | Karr | G06F 16/1727 |
| 2018/0267720 A1* | 9/2018 | Goldberg | G06F 3/0679 |
| 2020/0264789 A1* | 8/2020 | Wen | G06F 3/0647 |
| 2021/0117122 A1* | 4/2021 | Byun | G06F 3/0659 |

FOREIGN PATENT DOCUMENTS

| | | |
|---|---|---|
| CN | 105204783 A | 12/2015 |
| CN | 105677243 A | 6/2016 |
| CN | 106951375 A | 7/2017 |
| CN | 107102819 A | 8/2017 |
| CN | 107391774 A | 11/2017 |
| CN | 107515728 A | 12/2017 |
| CN | 107766180 A | 3/2018 |
| IN | 109445681 A | 3/2019 |

OTHER PUBLICATIONS

Wu et al., "A Demand-based Caching Method for Garbage Collection in Flash-Memory Embedded Systems", 2017 IEEE 6th Global Conference on Consumer Electronics (GCCE 2017), total 5 pages.

* cited by examiner

GARBAGE COLLECTION AND DATA STORAGE METHOD AND APPARATUS, AND STORAGE SYSTEM

CROSS-REFERENCE TO RELATED APPLICATIONS

This application is a continuation of International Application No. PCT/CN2019/098256, filed on Jul. 30, 2019, which claims priority to Chinese Patent Application No. 201810983555.0, filed on Aug. 27, 2018. The disclosures of the aforementioned applications are hereby incorporated by reference in their entireties.

TECHNICAL FIELD

The embodiments relate to the field of information technologies, and more specifically, to a data storage method and apparatus, and a storage system.

BACKGROUND

Data security is a key indicator for measuring performance of a storage system. Many data protection mechanisms are provided in the prior art to ensure that data is securely stored in the storage system. For example, an erasure code principle is provided. To be specific, raw data is encoded in an erasure code (EC) encoding manner to generate a plurality of data slices, and the data slices are stored in a plurality of memories. After one of the plurality of memories is faulty and data in the memory is lost, the lost data may be recovered by using a data slice stored in another memory. In another example, image storage is provided. To be specific, data is stored in an image manner. A primary node and a secondary node of the storage system each store a same piece of data. In this way, after one memory in the primary node is faulty and data is lost, the lost data may be replicated from the secondary node to another memory in the primary node.

However, when the lost data is recovered in either an EC manner or the image manner, the recovered data is randomly stored in a storage area of the memory. As a result, data stored in the storage area has greatly different expiration time. Garbage collection is performed based on a storage area in a garbage collection (GC) mechanism. When a storage area occupied by invalid data in the storage area is collected, the garbage collection can be performed on a to-be-collected storage area only after valid data in the storage area is first migrated to another storage area. Consequently, the garbage collection takes a long time and is inefficient.

SUMMARY

The embodiments provide a data storage method and apparatus, to help reduce time occupied by garbage collection, and improve efficiency of the garbage collection.

According to a first aspect, a data storage method is provided. The method is applied to a storage system. The storage system includes at least one first memory. The storage system further includes a second memory. The at least one first memory includes a plurality of storage areas. Garbage collection is performed based on each of the plurality of storage areas. The method includes: after a data failure occurs in the second memory, obtaining expiration time of a plurality of pieces of to-be-recovered target valid data, and recovering the plurality of pieces of target valid data, where the expiration time is used to indicate time when valid data becomes invalid data; and selecting a target storage area from the plurality of storage areas, and storing in the target storage area, at least some target valid data of the plurality of pieces of recovered target valid data, where after the at least some target valid data is stored in the target storage area, a time length between the earliest expiration time and the latest expiration time in expiration time of valid data stored in the target storage area is less than or equal to a preset time length.

Before the plurality of pieces of target valid data is stored in the target storage area, the target storage area may be a blank storage area in which no data is stored, or may be a storage area in which some data is stored.

The valid data stored in the target storage area may include the at least some target valid data of the plurality of pieces of target valid data and may further include other data other than the at least some target valid data. The other valid data may be data stored in the target storage area before the at least some target valid data is stored, and may further be data newly written into the target storage area in an appending write manner after the at least some target valid data is stored.

The time length between the earliest expiration time and the latest expiration time in the expiration time of the valid data stored in the target storage area is less than or equal to the preset time length. The following three cases are classified as follows:

Case 1: If there is valid data in the target storage area before the at least some target valid data is stored this time, and after the at least some target valid data is stored this time, in a set including the valid data stored this time and the existing valid data, the time length between the earliest expiration time of the valid data and the latest expiration time of the valid data is less than or equal to the preset time length.

Case 2: If there is not valid data in the target storage area before the at least some target valid data is stored this time, in the stored valid data, the time length between the earliest expiration time of the valid data and the latest expiration time of the valid data is less than or equal to the preset time length.

Case 3: If other valid data continues to be stored in the target storage area after the at least some target valid data is stored this time, in a set including the at least some target valid data stored this time and the other valid data, the time length between the earliest expiration time of the valid data and the latest expiration time of the valid data is less than or equal to the preset time length.

It should be noted that the three cases can also be combined, for example, Case 3 can be combined separately with Case 1 and Case 2. If Case 3 and Case 1 are combined, the target storage area may store three parts of data: the valid data stored in the target storage area before the at least some target valid data is stored, the at least some target valid data, and the other valid data stored in the target storage area after the at least some target valid data is stored. In a set including the valid data stored in the target storage area before the at least some target valid data is stored, the at least some target valid data, and the other valid data stored in the target storage area after the at least some target valid data is stored, the time length between the earliest expiration time of the valid data and the latest expiration time of the valid data is less than or equal to the preset time length.

In this embodiment, the time length between the earliest expiration time and the latest expiration time in the expiration time of the valid data stored in the target storage area is limited to be less than or equal to the preset time length, so that the expiration time of the valid data stored in the target storage area is comparatively centralized. This helps reduce time occupied for migrating the valid data and improve efficiency of the garbage collection in a process of performing the garbage collection in the target storage area.

In the process of performing the garbage collection based on a storage area, if garbage collection time is earlier than the earliest expiration time, the storage area does not need to be collected. If the garbage collection time is later than the latest expiration time, all data in the storage area becomes invalid data and can be collected directly. There is no need to perform a step of migrating the valid data. If the garbage collection time is between the earliest expiration time and the latest expiration time, because expiration time of the data stored in the storage area is comparatively centralized, from a macroscopic perspective, a data amount of the valid data that needs to be migrated in each storage area is less than a data amount of valid data that needs to be migrated in a conventional data recovery storage mechanism.

In a possible implementation, after the at least some target valid data is stored in the target storage area, the expiration time of the valid data stored in the target storage area may further be all the same. Therefore, if all the data in the target storage area is invalid and the garbage collection needs to be performed, there is no need to perform the step of migrating the valid data. This greatly reduces the time occupied for migrating the valid data in the process of the garbage collection.

In a possible implementation, data stored in the plurality of storage areas is written in a sequential write manner.

In a possible implementation, the at least one first memory and the second memory are shingled magnetic recording (SMR) hard disks, and each of the plurality of storage areas is a sequential zone (Szone).

In a possible implementation, the at least one memory is a solid-state drive (SSD), and each of the plurality of storage areas is a block.

In a possible implementation, the method further includes: determining a storage sequence of the plurality of pieces of target valid data based on the expiration time of each of the plurality of pieces of target valid data, where the storage sequence is used to indicate to write all valid data to-be-stored in a next storage area into the next storage area after data to-be-stored in the target storage area, of the plurality of pieces of target valid data is all written, and the next storage area is a storage area other than the target storage area in the plurality of storage areas; and the selecting a target storage area from the plurality of storage areas, and storing in the target storage area, at least some target valid data of the plurality of recovered target valid data includes: selecting the target storage area from the plurality of storage areas, and storing the at least some target valid data in the target storage area according to the storage sequence.

In this embodiment, the at least some target valid data is stored in the target storage area according to the storage sequence. The storage sequence is used to indicate that the data to-be stored in the same storage area, of the plurality of pieces of target valid data is continuously written into. This avoids a case in which in a process of storing the plurality of pieces of target valid data, adjacently written target valid data is data stored in different target storage areas and consequently, frequent switchovers need to be performed between the different target storage areas in a process of storing the adjacently written target valid data. This helps improve efficiency of storing the target valid data. In particular, for the SMR hard disk, when the adjacently written target valid data is stored in different target storage space, a magnetic head of the SMR hard disk swings, and time for data storage increases. Consequently, performance for writing data by the SMR hard disk is seriously affected.

In a possible implementation, the expiration time of any piece of target valid data of the plurality of pieces of target valid data is stored in metadata of a data slice corresponding to the any piece of target valid data. Any piece of target valid data and the data slice corresponding to the any piece of target valid data are generated by performing erasure code encoding on raw data.

In one possible implementation, the expiration time is represented by a life cycle of data and write time of the data. The life cycle of the data can be determined based on a service to which the data belongs, and data belonging to different services has a life cycle corresponding to the data.

According to a second aspect, a data storage apparatus is provided. The apparatus includes modules configured to perform the foregoing method.

According to a third aspect, a storage system is provided. The storage system includes modules configured to perform the foregoing method.

According to a fourth aspect, a storage system is provided, including at least one processor and at least one memory. The at least one memory is configured to store a computer program. The at least one processor is configured to invoke the computer program from the memory and run the computer program, so that the storage system performs the foregoing method.

It should be noted that the at least one processor and the at least one memory can be located in a plurality of different storage nodes or located in a same storage node.

According to a fifth aspect, a storage system is provided, including at least one processor and at least one memory. The at least one memory is configured to store a computer program. The at least one processor is configured to invoke the computer program from the memory and run the computer program, so that the storage system performs the foregoing method.

According to a sixth aspect, a computer program product is provided. The computer program product includes computer program code. When the computer program code is run on a computer, the computer is enabled to perform the method in the foregoing aspects.

It should be noted that some or all the computer program code can be stored in a first storage medium. The first storage medium can be encapsulated with a processor or encapsulated separately from a processor. This is not limited in this embodiment.

According to a seventh aspect, a computer-readable medium is provided. The computer-readable medium stores program code. When the computer program code is run on a computer, the computer is enabled to perform the method in the foregoing aspects.

DETAILED DESCRIPTION OF EMBODIMENTS

For ease of understanding of the embodiments, terms in the embodiments are first briefly described.

1. Garbage Collection

Garbage collection is a mechanism for managing storage space. When remaining storage space of the storage space is insufficient, invalid data stored in the storage space may be deleted by using the garbage collection mechanism, to achieve an objective of collecting a storage resource. The collected storage resource may be used to store other valid data, to improve storage space utilization.

2. Invalid Data and Valid Data

The invalid data may be understood as data that needs to be deleted from a storage system, for example, may be data whose life cycle expires, or data whose expiration time ends.

The valid data may be understood as data that needs to be continuously stored in the storage system, for example, may be data whose life cycle does not expire, or data whose expiration time does not end.

3. Storage Area

The storage area may be a basis for garbage collection, namely, a basic unit for performing the garbage collection on a memory. For example, the storage area may be an integer multiple of a minimum basis for performing the garbage collection on the memory or may be a minimum basis for performing the garbage collection on the memory.

When the memory is a shingled magnetic recording (SMR) hard disk, the basic unit for the garbage collection may include at least one sequential zone (Szone). A size of each sequential zone is usually 256 MB. When the memory is a solid-state drive (or solid-state drives, SSD), the basic unit for the garbage collection may include at least one block.

The following describes solutions of the embodiments with reference to accompanying drawings.

Figure 1:
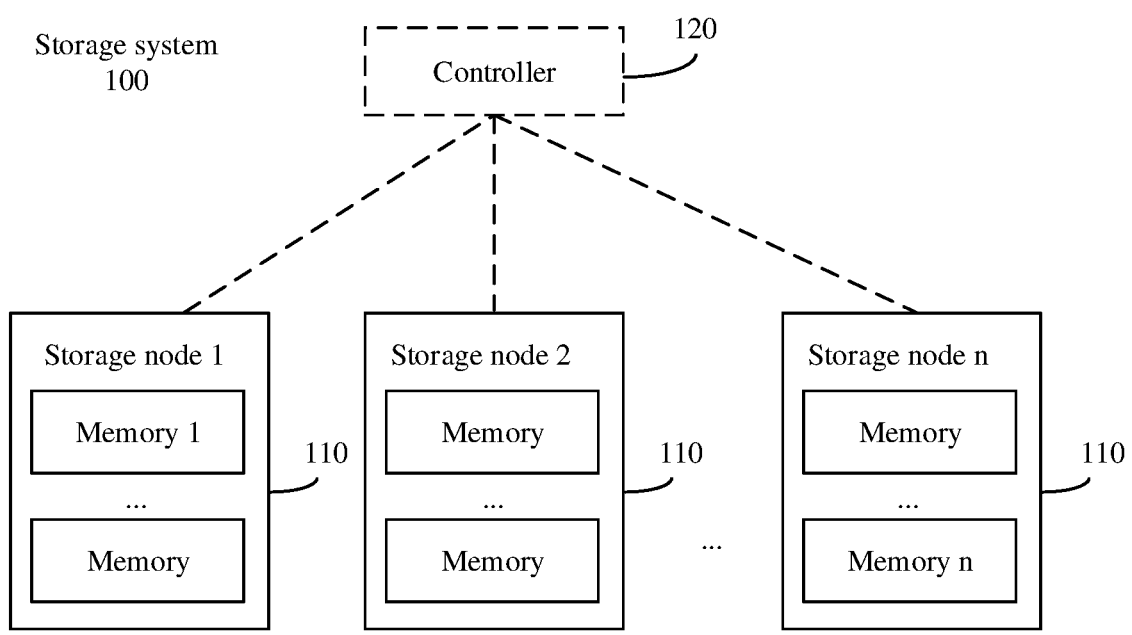
FIG. 1 is an architectural diagram of a storage system to which an embodiment is applied.

An architecture of a storage system to which an embodiment is applied is first described with reference to FIG. 1. FIG. 1 is an architectural diagram of the distributed storage system to which the embodiment is applied. The distributed storage system 100 shown in FIG. 1 includes a plurality of storage nodes 110 and a controller 120.

In the plurality of storage nodes 110, namely, in a storage node 1 to a storage node n, a plurality of memories may be disposed in each storage node. This can include m memories, namely, a memory 1 to a memory m, which are disposed in the storage node 1 to the storage node n, where n and m are positive integers greater than 1. A storage node may provide storage space for data by using a memory in the storage node.

The storage node may be a storage node in a distributed storage system, for example, a storage server. The storage node may further be a storage node in a cluster storage system. In this case, any foregoing storage node may be used as a primary node, and another storage node may be used as a mirror node (also referred to as a secondary node) of the primary node.

The controller 120 is configured to recover lost data.

It should be noted that the controller may be a controller that has a control function and that is independent of the storage node, or the controller may be a controller located in a storage node. For example, the storage system is the distributed system. The controller can include at least one processor. The at least one processor can be distributed in at least one storage node (server). When the storage system is the cluster storage system, the controller can be located in the primary node, for example, a processor in the primary node.

If a data failure occurs in a memory in the storage system, and data stored in the memory is lost, the controller can recover, by using a data protection mechanism (for example, erasure coding (EC) or mirror storage), the lost data based on data stored in another memory in the storage system, and randomly store the recovered data in the storage system.

In the mechanism of randomly storing the recovered data in the storage system, expiration time of the recovered data stored in each target storage area in the storage system is random. In a process of performing garbage collection based on a storage area, only a small portion of data in a to-be-collected storage area is usually at the expiration time, and becomes invalid data, and remaining data is still valid data. In this case, the garbage collection can be performed on the to-be-collected storage area only after a large amount of valid data is migrated from the to-be-collected storage area to another storage area.

Figure 2:
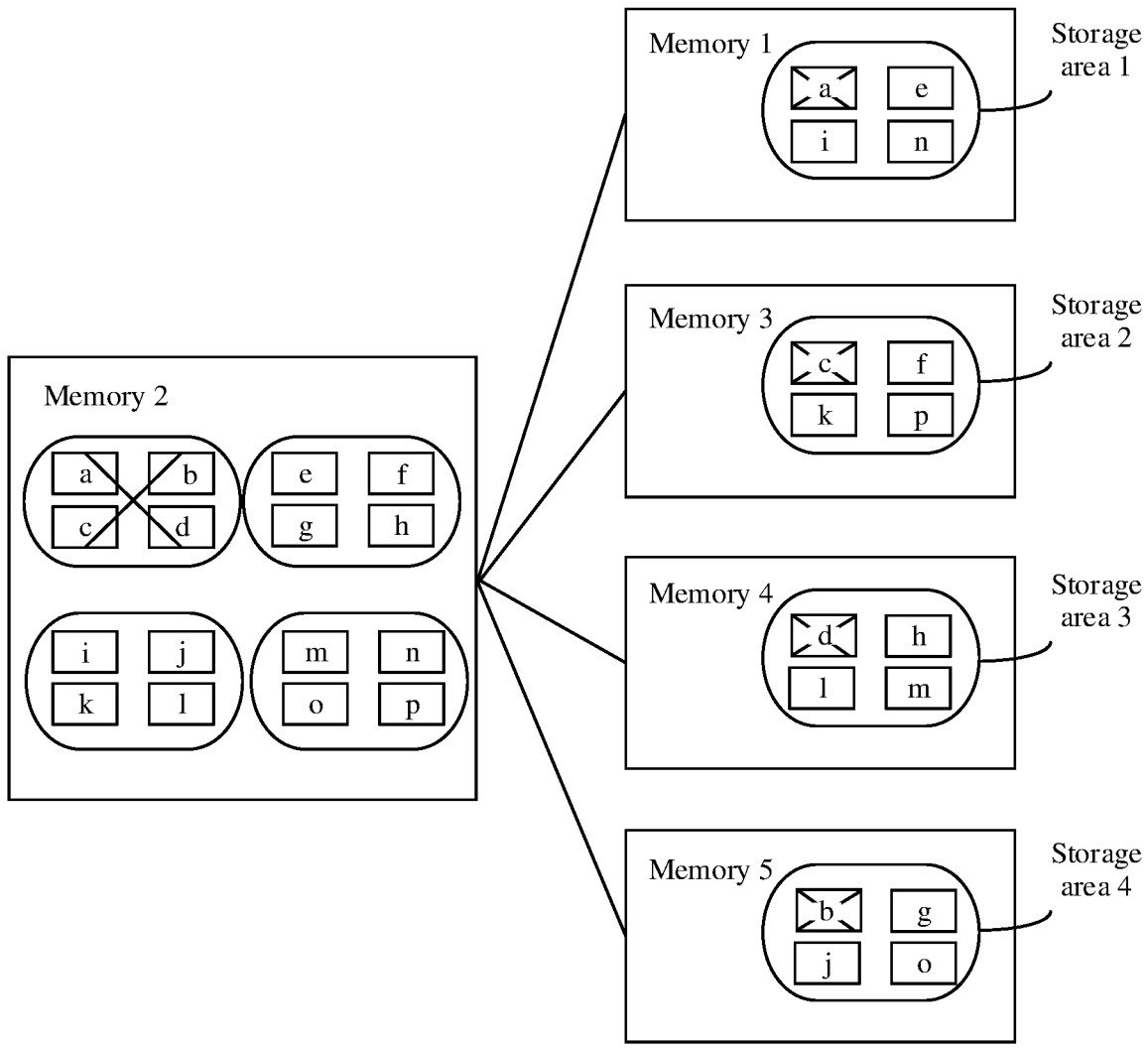
FIG. 2 is a schematic diagram of a storage result of storing recovered data based on a random storage mechanism.
Figure 3:
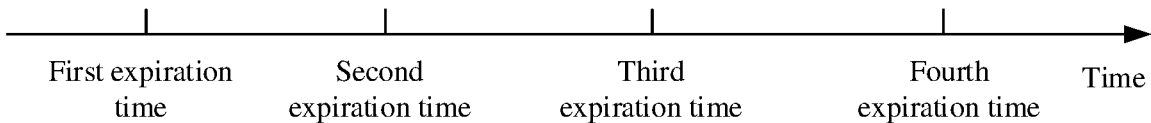
FIG. 3 is a schematic diagram of a chronological order among expiration time.

For example, FIG. 2 is a schematic diagram of a storage result of storing the recovered data based on the random storage mechanism. It is assumed that a memory 2 in the plurality of memories stores data a to data p. Expiration time of the data a, data b, data c, and data d is first expiration time. Expiration time of data e, data f, data g, and data h is second expiration time. Expiration time of data i, data j, data k, and data l is third expiration time. Expiration time of data m, data n, data o, and the data p is fourth expiration time. A chronological order of the first expiration time, the second expiration time, the third expiration time, and the fourth expiration time is shown in FIG. 3.

When the memory 2 is faulty and the data a to the data p stored in the memory 2 is lost, the lost data in the memory 2 needs to be recovered by using the data stored in the another memory. The recovered data is randomly stored in a storage area 1 of a memory 1, a storage area 2 of a memory 3, a storage area 3 of a memory 4, and a storage area 4 of a memory 5. Finally, the storage area 1 stores the data a, the data e, the data i, and the data n. The storage area 2 stores the data c, the data f, the data k, and the data p. The storage area 3 stores the data d, the data h, the data l, and the data m. The storage area 4 stores the data b, the data g, the data j, and the data o. If the garbage collection is performed on the four storage areas in a time period between the first expiration time and the second expiration time, namely, if only the data a in the storage area 1, the data c in the storage area 2, the data d in the storage area 3, and the data b in the storage area 4 expire, and remaining data is valid data, and before the four storage areas are collected, valid data in each storage area needs to be migrated to the another storage area. Consequently, migration of the large quantity of data results in a large amount of time occupied by the garbage collection, and low efficiency.

To reduce the time occupied by the garbage collection, the embodiments provide a new technology for storing recovered data. In this technology, recovered data having comparatively centralized expiration time (namely, target valid data described below) is stored in a same storage area (namely, target storage area described below). When garbage collection is performed based on a storage area, time occupied for migrating valid data is reduced, and efficiency of the garbage collection is improved. This avoids the following case in a conventional method for storing the recovered data: the recovered data is randomly stored in the storage area, and consequently expiration time of the recovered data stored in each storage area is random; only some scattered data in each storage area in the storage system expires in a process of performing the garbage collection based on the storage area, and consequently a data amount of valid data that needs to be migrated is comparatively large.

Figure 4:
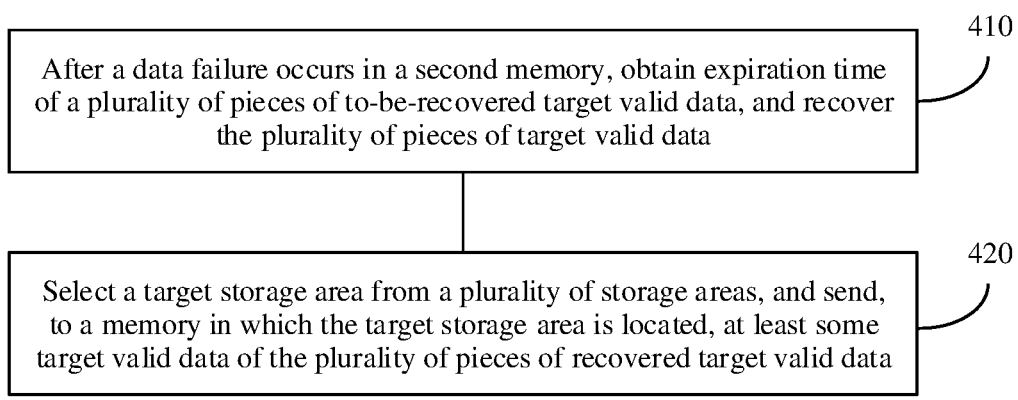
FIG. 4 is a schematic flowchart of a data storage method according to an embodiment.

The following describes a data storage method in an embodiment with reference to FIG. 4. The method is applied to a storage system (for example, the storage system shown in FIG. 1). For ease of description, a memory that works normally in the storage system is referred to as a first memory, and a memory in which data failure occurs in the storage system is referred to as a second memory. The memory that works normally includes a plurality of storage areas.

FIG. 4 is a schematic flowchart of the data storage method according to this embodiment. The method shown in FIG. 4 may be performed by a device having a control function in the storage system, for example, the controller shown in FIG. 1. The method shown in FIG. 4 includes a step 410 and a step 420.

410: After the data failure occurs in the second memory, obtain expiration time of a plurality of pieces of to-be-recovered target valid data, and recover the plurality of pieces of target valid data.

The expiration time is used to indicate time when valid data becomes invalid data and may be directly stored in the storage system. The expiration time may further be indirectly stored in the storage system in a time attribute manner. For example, the time attribute may include a life cycle of data and write time of the data. The life cycle of the data is used to indicate total duration of storing the data in the storage system. The write time is used to indicate time when the data is written into the storage system. The write time is used as a start moment of the life cycle, and after the total duration indicated by the life cycle, an end moment of the life cycle is the expiration time.

The life cycle of the data can be determined based on a service to which the data belongs, and data belonging to different services has a life cycle corresponding to the data.

In an EC scenario, EC encoding is usually performed on raw data that does not store in the storage system, to generate a plurality of data slices. Because the plurality of data slices are generated based on the raw data, when the plurality of data slices are written into the storage system, the plurality of data slices are continuously written into different memories in the storage system. In other words, write time of the plurality of data slices are the same. Therefore, expiration time of each of the plurality of data slices are the same.

When the data failure occurs in the second memory, and a target valid data slice (namely, target valid data) in the plurality of data slices stored in the second memory is lost, expiration time of the target valid data slice may be obtained from another data slice in the plurality of data slices stored in the storage system.

It should be noted that when the storage system is a distributed storage system, after a client of the distributed storage system receives data written by a user, and divides the data written by the user into a plurality of data slices through the EC encoding, the life cycle may be added to metadata of each data slice based on a service to which service data belongs.

When each storage node (including a data slice node and a redundant slice node) in the distributed storage system receives at least some data slices of the plurality of data slices, the write time may be added to the metadata of each data slice in a process of storing the data slice into a storage node.

If the expiration time of each data slice is directly stored in metadata of the plurality of data slices, the expiration time may be directly added to the metadata of the data slice by each storage node in the process of writing the data slice.

In a mirror storage scenario, data needs to be stored in a primary node, and the data in the primary node also needs to be backed up in a secondary node. Because data stored in the secondary node is a copy of the data stored in the primary node, expiration time of the data stored in the primary node is the same as expiration time of the copy data of the data stored in the secondary node.

When the data failure occurs in the second memory (for example, any memory in the primary node), and target valid data stored in the second memory is lost, expiration time of the target valid data may be obtained from the secondary node.

Figure 5:
FIG. 5 is a schematic diagram of a structure of a time attribute according to an embodiment.

When the data failure occurs in the second memory, to obtain the expiration time of the plurality of pieces of to-be-recovered target valid data, in a process of storing data in the storage system, expiration time of the data needs to be added to metadata corresponding to the data, or a time attribute used to indicate expiration time of the data needs to be added, for example, a life cycle of the data and write time of the data. FIG. 5 is a schematic diagram of a structure of the time attribute according to this embodiment. It should be noted that the structure of the time attribute shown in FIG. 5 is merely a possible implementation, and the structure of the time attribute may alternatively have another implementation.

It can be seen from the schematic diagram of the structure of the time attribute shown in FIG. 5 that the time attribute may occupy 17 bits in total. The life cycle may occupy 5 bits, and the write time may occupy 12 bits. A unit of the write time may be day. The structure of the time attribute may support $2^5=32$ services having different life cycles and may support a data write amount of $2^{12}(\text{day})=10(\text{year})$.

The recovering the target valid data may include recovering the plurality of target valid data based on data stored in the storage system.

In the EC scenario, EC decoding may be performed on the plurality of data slices stored in the storage system, to recover the plurality of pieces of target valid data. For a specific decoding manner of the EC decoding, refer to a conventional EC decoding manner. Details are not described in this embodiment.

In the mirror storage scenario, the plurality of pieces of target valid data may be replicated in the secondary node, to recover the plurality of pieces of target valid data.

In addition, a time relationship between the process of performing the data recovery, and the step 410, or the step 420 of selecting a target storage area is comparatively flexible. For example, the process of performing the data recovery may be performed before the step 410, the process of performing the data recovery may be performed before the target storage area is selected, the process of performing the data recovery may be performed after the target storage area is selected, or the process of performing the data recovery may be performed after the step 410. This is not limited in this embodiment. When the process of performing the data recovery is performed before the step 410, the expiration time of the plurality of pieces of target valid data can be obtained directly from metadata of recovered data.

420: Select the target storage area from the plurality of storage areas, and send, to a memory in which the target storage area is located, at least some target valid data of the plurality of pieces of recovered target valid data, where after the at least some target valid data is stored in the target storage area, a time length between the earliest expiration time and the latest expiration time in expiration time of valid data stored in the target storage area is less than or equal to a preset time length.

Before the plurality of pieces of target valid data is stored in the target storage area, the target storage area may be a blank storage area in which no data is stored, or may be a storage area in which some data is stored.

The valid data stored in the target storage area may include the at least some target valid data of the plurality of pieces of target valid data and may further include other data other than the at least some target valid data. The other valid data may be data stored in the target storage area before the at least some target valid data is stored, and may further be data newly written into the target storage area in an appending write manner after the at least some target valid data is stored.

The time length between the earliest expiration time and the latest expiration time in the expiration time of the valid data stored in the target storage area is less than or equal to the preset time length. The following three cases are classified:

Case 1: If there is valid data in the target storage area before the at least some target valid data is stored this time, and after the at least some target valid data is stored this time, in a set including the valid data stored this time and the existing valid data, the time length between the earliest expiration time of the valid data and the latest expiration time of the valid data is less than or equal to the preset time length.

Case 2: If there is not valid data in the target storage area before the at least some target valid data is stored this time, in the stored valid data, the time length between the earliest expiration time of the valid data and the latest expiration time of the valid data is less than or equal to the preset time length.

Case 3: If other valid data continues to be stored in the target storage area after the at least some target valid data is stored this time, in a set including the at least some target valid data stored this time and the other valid data, the time length between the earliest expiration time of the valid data and the latest expiration time of the valid data is less than or equal to the preset time length.

It should be noted that the three cases can also be combined, for example, Case 3 can be combined separately with Case 1 and Case 2. If Case 3 and Case 1 are combined, the target storage area may store three parts of data: the valid data stored in the target storage area before the at least some target valid data is stored, the at least some target valid data, and the other valid data stored in the target storage area after the at least some target valid data is stored. In a set including the valid data stored in the target storage area before the at least some target valid data is stored, the at least some target valid data, and the other valid data stored in the target storage area after the at least some target valid data is stored, the time length between the earliest expiration time of the valid data and the latest expiration time of the valid data is less than or equal to the preset time length.

The valid data stored in the target storage area may include some target valid data of the plurality of pieces of target valid data, and the valid data stored in the target storage area may include all target valid data of the plurality of pieces of target valid data.

As described above, if the target storage area is originally the blank storage area, the at least some target valid data may be directly stored in the target storage area. If the target storage area originally stores data, it needs to be ensured that a time length between the earliest expiration time and the latest expiration time in expiration time of both to-be-stored data and the stored data in the target valid storage area is less than or equal to the preset time length.

In this embodiment, the time length between the earliest expiration time and the latest expiration time in the expiration time of the valid data stored in the target storage area is limited to be less than or equal to the preset time length, so that the expiration time of the valid data stored in the target storage area is comparatively centralized. This helps reduce time occupied for migrating the valid data and improve efficiency of the garbage collection in a process of performing the garbage collection in the target storage area.

In the process of performing the garbage collection based on a storage area, if garbage collection time is earlier than the earliest expiration time, the storage area does not need to be collected. If the garbage collection time is later than the latest expiration time, all data in the storage area becomes invalid data and can be collected directly. There is no need to perform a step of migrating the valid data. If the garbage collection time is between the earliest expiration time and the latest expiration time, because expiration time of the data stored in the storage area is comparatively centralized, from a macroscopic perspective, a data amount of the valid data that needs to be migrated in each storage area is less than a data amount of valid data that needs to be migrated in a conventional data recovery storage mechanism.

Additionally, it should be noted that the expiration time of valid data stored in the target storage area may further be all the same. For example, the data stored in the target storage area either becomes the invalid data simultaneously, or is valid data. Therefore, if all the data in the target storage area is invalid and the garbage collection needs to be performed, there is no need to perform the step of migrating the valid data. This greatly reduces the time occupied for migrating the valid data in the process of the garbage collection.

When the expiration time is indicated by using the time attribute, the data having the same expiration time may be data having a same life cycle and same write time. The data having the same expiration time may further be data having different write time and different life cycles but having same end time of the life cycles, for example, data having a same remaining life cycle and same time for recovering the data. The remaining life cycle indicates remaining valid time after the data recovery. In other words, the time for recovering the data is used as a start point, and after the remaining life cycle, end time of the remaining life cycle is the expiration time of the data.

Figure 6:
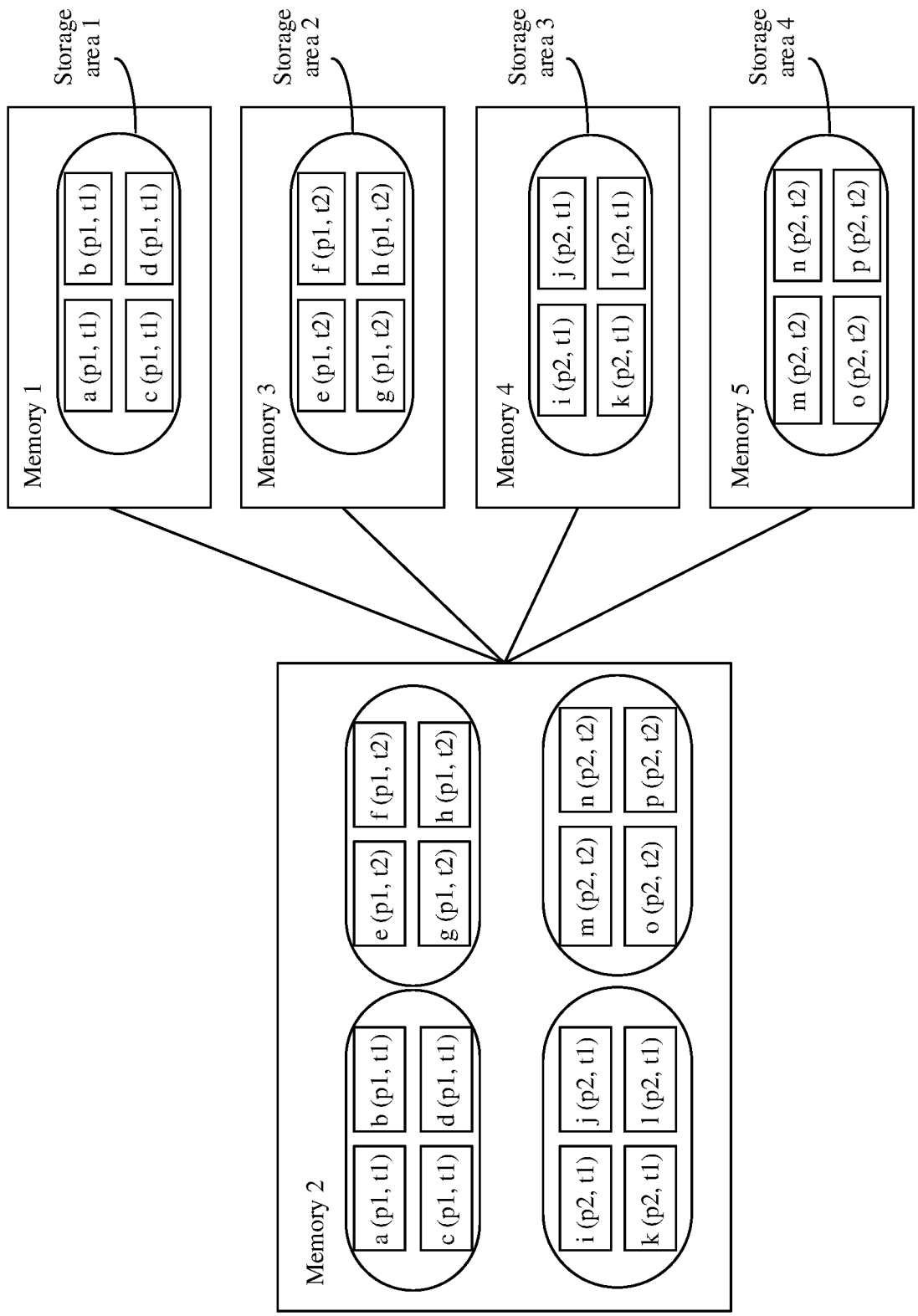
FIG. 6 is a schematic diagram of a storage result of recovered data according to an embodiment.

FIG. 6 is a schematic diagram of a storage result of the recovered data according to this embodiment. In the storage result shown in FIG. 6, a life cycle (period) represented by p and write time represented by t are used to indicate the data expiration time. It is assumed that a memory 2 in the plurality of memories stores data a to data p. Expiration time of the data a, data b, data c, and data d is first expiration time, and is represented by (p1, t1). Expiration time of data e, data f, data g, and data h is second expiration time, and is represented by (p1, t2). Expiration time of data i, data j, data k, and data l is third expiration time, and is represented by (p2, t1). Expiration time of data m, data n, data o, and the data p is fourth expiration time, and is represented by (p2, t2).

Based on a storage policy in which the expiration time of the valid data stored in the target storage area may be all the same, lost data in the memory 2 is recovered, and the recovered data is separately stored in a storage area 1 in a memory 1, a storage area 2 in a memory 3, a storage area 3 in a memory 4, and a storage area 4 in a memory 5. It can be understood from the storage result shown in FIG. 6 that in the storage area 1 to the storage area 4, life cycles of data stored in each storage area are the same, and write time of the data stored in each storage area is also the same.

The plurality storage areas can be located in one or more first memories. In addition, the at least one first memory and the second memory are located in one storage node, or the at least one first memory and the second memory may be located in different storage nodes. This is not limited in this embodiment.

The memory storing the expiration time of the plurality of pieces of target valid data may be a same memory as a memory storing the target valid data (namely, the memory where the target storage area is located). The memory storing the expiration time of the plurality of pieces of target valid data may alternatively be a memory different from the memory storing the target valid data (namely, the memory where the target storage area is located). This is not limited in this embodiment.

A storage node in which the memory storing the expiration time is located may be located in a same storage node as the at least one first memory. The storage node in which the memory storing the expiration time is located may alternatively be different from the storage node in which the at least one first memory is located.

A storage node in which the controller performing the step 410 and the step 420 is located may be a same storage node as the storage node in which the target storage area is located. In other words, after the data failure occurs in the second memory in the storage node, the controller in a server may perform the step 410 and the step 420, to store the target valid data in the target storage area.

The storage node in which the controller performing the step 410 and the step 420 is located may alternatively be a storage node different from the storage node in which the target storage area is located. In other words, the controller may send the at least some recovered target valid data to the storage node in which the target storage area is located. The storage node in which the target storage area is located stores the at least some target valid data in the target storage area.

The storage node in which the controller performing the step 410 and the step 420 is located may be a same storage node as the storage node in which the second memory is located, or the storage node in which the controller performing the step 410 and the step 420 is located may be a different storage node from the storage node in which the second memory is located.

It should be noted that the storage area for storing the data used to recover the target valid data may be in a same storage node or even a same memory as the target storage area. The storage area for storing the data used to recover the target valid data and the target storage area may be located in different storage nodes.

For a storage medium (for example, an Szone of an SMR and an SSD) that supports sequential write, in a process of writing data in a sequential write manner, data of a same data stream is naturally written into continuous storage space. In this way, expiration time of data stored in each target storage area is usually the same. Even if the expiration time of the data stored in each target storage area is not the same, the expiration time is usually comparatively centralized. In a process of performing the garbage collection on a target-storage area, a migration amount of valid data is usually not large. However, as described above, in the process of storing the recovery data, random storage of the recovered data results in random expiration time of the recovered data stored in the target storage area. Therefore, the method in this embodiment also applies to the storage medium that supports the sequential write.

It should be noted that the memory in the embodiment may be "a sequential write medium", such as the SSD or the SMR, or an "appending write" (appending) memory. For example, for a non-sequential write memory (for example, a common hard disk drive (HDD)), software (for example, storage management software) may be used to logically specify that data is written into the memory in an appending write manner. In this case, this embodiment is also applicable. In the appending write memory, newly written data cannot directly overwrite existing data. For example, the newly written data is appended to the existing data in the memory for storage.

In the process of storing the target valid data in the target storage area, data that needs to be stored in a same target storage area may be usually continuously written into. This avoids a case in which in a process of storing the plurality of pieces of target valid data, adjacently written target valid data is data stored in different target storage areas and consequently, frequent switchovers need to be performed between the different target storage areas in a process of storing the adjacently written target valid data. This helps improve efficiency of storing the target valid data. In particular, for the SMR hard disk, when the adjacently written target valid data is stored in different target storage space, magnetic head of the SMR hard disk swings, and time for data storage increases. Consequently, performance for writing data by the SMR hard disk is seriously affected.

Therefore, before the target valid data is stored in the target storage area, a storage sequence of the plurality of pieces of target valid data is first determined based on the expiration time of the plurality of pieces of target valid data. The to-be-stored target valid data in a same storage area, of the plurality of pieces of target valid data is continuously written into the target storage area according to the storage sequence.

For example, the storage sequence of the plurality of pieces of target valid data is determined based on the expiration time of each of the plurality of pieces of target valid data. The storage sequence is used to indicate to write all valid data to-be-stored in a next storage area into the next storage area after data to-be-stored in the target storage area, of the plurality of pieces of target valid data is all written into. The next storage area is a storage area other than the target storage area in the plurality of storage areas. The step 420 further includes selecting the target storage area from the plurality of storage areas, and storing the at least some target valid data in the target storage area according to the storage sequence.

A specific sorting manner of the storage sequence may be used in combination with the storage policy described above. For example, if the storage policy is storing target valid data having the same expiration time in a same storage area, the storage sequence may indicate to continuously write the target valid data having the same expiration time. For another example, if the storage policy is storing target valid data whose expiration time is within a preset time length threshold in a same storage area, the storage sequence may indicate to continuously write the target valid data that meets the storage policy.

It should be noted that, in the foregoing process of establishing the storage sequence, after the plurality of pieces of target valid data is recovered, the recovered target valid data is stored in the target storage area according to the storage sequence. The process of establishing the storage sequence may further be performed before the plurality of pieces of target valid data are recovered.

If the process of establishing the storage sequence is performed after the plurality of pieces of target valid data are recovered, data stored in one storage area may be aggregated into one data set based on the expiration time to be temporarily stored. Then, the target valid data in the data set is sequentially stored in the storage area on a data-set-basis.

If the process of establishing the storage sequence is performed before the plurality of pieces of target valid data are recovered, in this case, the plurality of target valid data slices does not recover, and the storage sequence may be adjusted by adjusting a data recovery sequence.

The following describes a method for adjusting the data storage sequence by using an example in which the expiration time of the valid data stored in the target storage area is the same. The expiration time or the time attribute used to indicate the expiration time may be used as keys to add to the metadata of the data. Therefore, a conventional hash algorithm may be reused to hash the keys of the plurality of pieces of target valid data. In this way, data carrying a same key may be hashed to a same bucket. Then the plurality of pieces of target valid data is recovered on a bucket basis. The recovered target valid data is stored in a target storage area corresponding to the bucket.

For example, data that needs to be stored for 10 days is written into the second memory on Jun. 2, 2018, data that needs to be stored for 10 days is written into the second memory on Jun. 1, 2018, and data that needs to be stored for 30 days is written into the second memory on Jun. 2, 2018. In this case, time attributes (life cycles and write time) stored in the metadata of the data are respectively 1020180602, 1020180601, and 3020180602.

When the data in the second memory is faulty, time attributes of the data that needs to be recovered may be respectively 1020180602, 1020180601, and 3020180602 obtained from the storage system. The time attributes are respectively used as keys for hashing. In this case, the data that needs to be stored for 10 days and written on Jun. 2, 2018, data that needs to be stored for 10 days and written on Jun. 1, 2018, and data that needs to be stored for 30 days and written on Jun. 2, 2018 are respectively hashed to the hash buckets with keys 1020180602, 1020180601, and 3020180602 are used. Then, data in buckets 1020180602, 1020180601, and 3020180602 is recovered in sequence according to a sequence of hash buckets. In this way, the data stored in the same storage area can be successively written into.

The foregoing describes in detail the data storage method in the embodiments with reference to FIG. 1 to FIG. 6. The following describes in detail a data storage apparatus in the embodiments with reference to FIG. 7 to FIG. 8. It should be noted that the apparatus shown in FIG. 7 and FIG. 8 may implement the steps in the foregoing methods. For the sake of brevity, details are not described herein again.

Figure 7:
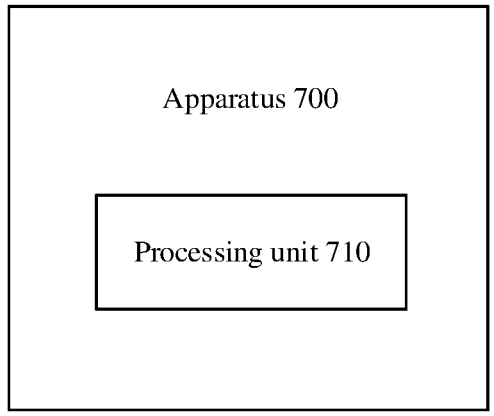
FIG. 7 is a schematic diagram of a data storage apparatus according to an embodiment.

FIG. 7 is a schematic diagram of a data storage apparatus according to an embodiment. The apparatus 700 shown in FIG. 7 may be applied to a storage system. The storage system includes at least one first memory. The storage system further includes a second memory. The at least one first memory includes a plurality of storage areas. Garbage collection is performed based on each of the plurality of storage areas. The apparatus 700 may include a processing unit 710.

The processing unit 710 is configured to after a data failure occurs in the second memory, obtain expiration time of a plurality of pieces of to-be-recovered target valid data. The expiration time is used to indicate time when valid data becomes invalid data.

The processing unit 710 is further configured to select a target storage area from the plurality of storage areas, and store at least some target valid data of the plurality of recovered target valid data to the target storage area. After the at least some target valid data is stored in the target storage area, a time length between the earliest expiration time and the latest expiration time in expiration time of valid data stored in the target storage area is less than or equal to a preset time length.

In this embodiment, the time length between the earliest expiration time and the latest expiration time in the expiration time of the valid data stored in the target storage area is limited to be less than or equal to the preset time length, so that the expiration time of the valid data stored in the target storage area is comparatively centralized. This helps reduce time occupied for migrating the valid data and improve efficiency of the garbage collection in a process of performing the garbage collection in the target storage area.

In a possible implementation, after the at least some target valid data is stored in the target storage area, the expiration time of the valid data stored in the target storage area is the same.

In a possible implementation, data stored in the plurality of storage areas is written in a sequential write manner.

In a possible implementation, the at least one first memory and the second memory are SMR hard disks, and each of the plurality of storage areas is an Szone.

In a possible implementation, the at least one memory is an SSD, and each of the plurality of storage areas is a block.

In a possible implementation, the processing unit is further configured to determine a storage sequence of the plurality of pieces of target valid data based on the expiration time of each of the plurality of pieces of target valid data, where the storage sequence is used to indicate that the data to-be stored in the same storage area, of the plurality of pieces of target valid data is continuously written into; and select the target storage area from the plurality of storage areas, and store the at least some target valid data in the target storage area according to the storage sequence.

In a possible implementation, the expiration time of any piece of target valid data of the plurality of pieces of target valid data is stored in metadata of a data slice corresponding to the any piece of target valid data. Any piece of target valid data and the data slice corresponding to the any piece of target valid data are generated by performing erasure code encoding on raw data.

In a possible implementation, the expiration time is represented by a life cycle of data and write time of the data.

In an optional embodiment, the apparatus 700 may alternatively be a controller 800. The processing unit 710 may be at least one processor 820. The controller 800 may further include at least one memory 810 and at least one input/output interface 830, which is shown in FIG. 8.

Figure 8:
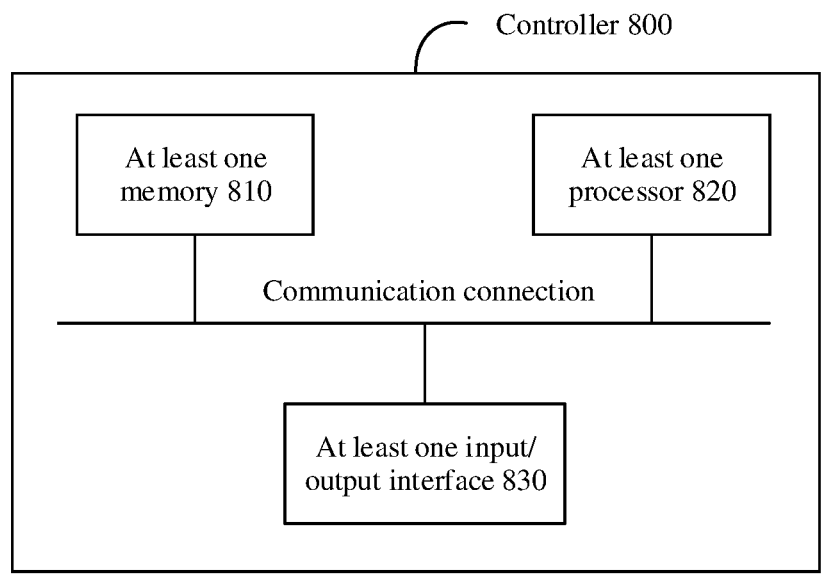
FIG. 8 is a schematic diagram of a controller according to an embodiment.

FIG. 8 is a schematic diagram of the controller according to this embodiment. The controller 800 shown in FIG. 8 may include the at least one memory 810, the at least one processor 820, and the at least one input/output interface

830. The at least one memory 810, the at least one processor 820, and the at least one input/output interface 830 are connected by using a communication connection. The at least one memory 810 is configured to store a program instruction. The at least one processor 820 is configured to execute the program instruction stored in the memory 810, to control the at least one input/output interface 830 to receive input data and information, and output data such as an operation result.

The memory 810 may include a read-only memory and a random access memory and provide an instruction and data to the processor 820. A part of the processor 820 may further include a non-volatile random access memory. For example, the processor 820 may further store information of a device type.

In an implementation process, steps in the foregoing method can be implemented by using a hardware integrated logical circuit in the processor 820, or by using instructions in a form of software. The method in the embodiments may be directly performed by a hardware processor or may be performed by using a combination of hardware in the processor and a software module. The software module may be located in a mature storage medium in the field, such as a random access memory, a flash memory, a read-only memory, a programmable read-only memory, an electrically erasable programmable memory, or a register. The storage medium is located in the memory 810. The processor 820 reads information in the memory 810 and completes the steps in the foregoing method in combination with hardware of the processor. To avoid repetition, details are not described herein.

It should be understood that, the processor in this embodiment may be a central processing unit (CPU), or may be another general purpose processor, a digital signal processor (DSP), an application-specific integrated circuit (ASIC), a field programmable gate array (FPGA), another programmable logic component, a discrete gate, a transistor logic device, discrete hardware component, or the like. The general purpose processor may be a microprocessor, or the processor may be any conventional processor, or the like.

An embodiment further provides a storage system. For an architectural diagram of the storage system, refer to FIG. 1. The storage system includes at least one first memory. The storage system further includes a second memory. The at least one first memory includes a plurality of storage areas. Garbage collection is performed based on each of the plurality of storage areas. The storage system may include a processing unit and a processing unit.

The processing unit is configured to after a data failure occurs in a second memory, obtain expiration time of a plurality of pieces of to-be-recovered target valid data. The expiration time is used to indicate time when valid data becomes invalid data.

The processing unit is configured to select a target storage area from the plurality of storage areas, and store at least some target valid data of the plurality of recovered target valid data to the target storage area. After the at least some target valid data is stored in the target storage area, a time length between the earliest expiration time and the latest expiration time in expiration time of valid data stored in the target storage area is less than or equal to a preset time length.

The storage system relates to three storage nodes: a storage node in which the second memory whose data fails is located, a storage node in which the target storage area is located, and a storage node in which the processing unit and the processing unit are located.

The three storage nodes may be a same storage node (for ease of description, temporarily referred to as a first storage node below). In this case, after the data failure occurs in a second memory in the first storage node, a controller in the first storage node stores the at least some restored target valid data into the target storage area in the first storage node. In this case, the storage system includes at least one storage node, namely, the first storage node.

The three storage nodes may alternatively be different storage nodes. For example, the storage node in which the second memory is located and the storage node in which the processing unit and the processing unit are located may be a same storage node (also referred to as a second storage node). However, the second storage node and the storage node in which the target storage area is located (also referred to as a third storage node) are different storage nodes. In other words, after the data failure occurs in a second memory in the second storage node, the second memory may perform data recovery on the plurality of pieces of target valid data by using the processing unit and the processing unit. The at least some target valid data in the plurality of pieces of recovered target valid data is sent to the third storage node, so that the third storage node stores the at least some target valid data in the target storage area. In this case, the storage system includes at least two storage nodes, namely, the second storage node and the third storage node.

In this embodiment, the time length between the earliest expiration time and the latest expiration time in the expiration time of the valid data stored in the target storage area is limited to be less than or equal to the preset time length, so that the expiration time of the valid data stored in the target storage area is comparatively centralized. This helps reduce time occupied for migrating the valid data and improve efficiency of the garbage collection in a process of performing the garbage collection in the target storage area.

In a possible implementation, after the at least some target valid data is stored in the target storage area, the expiration time of the valid data stored in the target storage area is the same.

In a possible implementation, data stored in the plurality of storage areas is written in a sequential write manner.

In a possible implementation, the at least one first memory and the second memory are SMR hard disks, and each of the plurality of storage areas is an Szone.

In a possible implementation, the at least one memory is an SSD, and each of the plurality of storage areas is a block.

In a possible implementation, the processing unit is further configured to determine a storage sequence of the plurality of pieces of target valid data based on the expiration time of each of the plurality of pieces of target valid data, where the storage sequence is used to indicate that the data to-be stored in the same storage area, of the plurality of pieces of target valid data is continuously written into; and select the target storage area from the plurality of storage areas, and store the at least some target valid data in the target storage area according to the storage sequence.

In a possible implementation, the expiration time of any piece of target valid data of the plurality of pieces of target valid data is stored in metadata of a data slice corresponding to the any piece of target valid data. Any piece of target valid data and the data slice corresponding to the any piece of target valid data are generated by performing erasure code encoding on raw data.

In a possible implementation, the expiration time is represented by a life cycle of data and write time of the data.

It should be understood that sequence numbers of the foregoing processes do not mean execution sequences in embodiments. The execution sequences of the processes should be determined based on functions and internal logic of the processes and should not be construed as any limitation on the implementation processes of the embodiments.

In the several embodiments provided, it should be understood that the system, apparatus, and method may be implemented in other manners. For example, the described apparatus embodiment is merely an example. For example, division into the unit is merely logical function division and may be other division in an actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, functional units in the embodiments may be integrated into one processing unit, each of the units may exist alone physically, or two or more units are integrated into one unit.

All or some of the foregoing embodiments may be implemented by using software, hardware, firmware, or any combination thereof. When software is used to implement the embodiments, all or some of the embodiments may be implemented in a form of a computer program product. The computer program product includes one or more computer instructions. When the computer program instructions are loaded and executed on a computer, the procedure or functions according to the embodiments are all or partially generated. The computer may be a general-purpose computer, a dedicated computer, a computer network, or other programmable apparatuses. The computer instruction may be stored in a computer-readable storage medium or may be transmitted from a computer-readable storage medium to another computer-readable storage medium. For example, the computer instruction may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a digital versatile disc (DVD), a semiconductor medium (for example, an SSD)), or the like.

The foregoing descriptions are merely implementations of the embodiments, but are not intended to limit the scope. Any variation or replacement readily figured out by a person of ordinary skill in the art within the scope of the embodiments shall fall within the protection scope of.

What is claimed is:

1. A data storage method comprising:
   after a data failure occurs in a second memory, recovering first data associated with the second memory of a storage system to obtain the first data, and obtaining an expiration time of the recovered first data associated with the second memory of the storage system;
   selecting, based on the expiration time of the recovered first data, a target storage area from a plurality of storage areas, wherein the plurality of storage areas belong to at least one first memory of the storage system; and
   sending at least a portion of the recovered first data to a first memory in which the target storage area is located, wherein
   after the at least a portion of the recovered first data is stored in the target storage area, the expiration time of the at least a portion of the recovered first data is between an earliest expiration time and a latest expiration time in expiration time of old data stored in the target area.

2. The method according to claim 1, wherein after the at least a portion of the recovered first data is stored in the target storage area, the expiration time of the recovered first data matches an expiration time of other data stored in the target storage area.

3. The method according to claim 1, wherein data stored in the plurality of storage areas is written in a sequential write manner.

4. The method according to claim 1, wherein the at least one first memory and the second memory are shingled magnetic recording (SMR) hard disks, and each of the plurality of storage areas is a sequential zone (Szone).

5. The method according to claim 1, wherein the at least one first memory is a solid-state drive (SSD), and each of the plurality of storage areas is a block.

6. The method according to claim 1, wherein the method further comprises:
   determining a storage sequence of the recovered first data based on the expiration time of the recovered first data; and
   selecting the target storage area from the plurality of storage areas, and storing in the target storage area, of at least a portion of the recovered first data comprises:
   selecting the target storage area from the plurality of storage areas and storing the at least a portion of the recovered first data in the target storage area according to the storage sequence.

7. The method according to claim 1, further comprising: determining valid data stored in the target storage area wherein the valid data comprises the at least a portion of the recovered first data and/or other data, and the other data comprises data stored in the target storage area before the at least a portion of the recovered first data is stored in the target storage area, and/or data stored in the target storage area after the at least a portion of the recovered first data is stored in the target storage area.

8. The method according to claim 1, wherein the expiration time of any piece of the recovered first data is stored in metadata of a data slice corresponding to the any piece of the recovered first data, and the any piece of the recovered first data and the data slice corresponding to the any piece of the recovered first data are generated by performing erasure code encoding on raw data.

9. The method according to claim 1, wherein the expiration time is represented by a life cycle of data and write time of the data.

10. A storage system, the storage system comprising a processor configured to:
    after a data failure occurs in a second memory, obtain an expiration time of first data associated with the second memory of a storage system, and recover the first data associated with the second memory of a storage system;

select, based on the expiration time of the recovered first data, a target storage area from a plurality of storage areas, wherein the plurality of storage areas belong to at least one first memory of the storage system; and send at least a portion of the recovered first data to a first memory in which the target storage area is located, wherein after the at least a portion of the recovered first data is stored in the target storage area, the expiration time of the at least a portion of the recovered first data is between an earliest expiration time and a latest expiration time in expiration time of old data stored in the target storage area.

11. The system according to claim 10, wherein after the at least a portion of the recovered first data is stored in the target storage area, the expiration time of the recovered first data matches an expiration time of other data stored in the target storage area.

12. The system according to claim 10, wherein data stored in the plurality of storage areas is written in a sequential write manner.

13. The system according to claim 10, wherein the first memory and the second memory are shingled magnetic recording (SMR) hard disks, and each of the plurality of storage areas is a sequential zone (Szone).

14. The system according to claim 10, wherein the at least one first memory is a solid-state drive (SSD), and each of the plurality of storage areas is a block.

15. The system according to claim 10, wherein the processor is further configured to:

determine a storage sequence of the recovered first data based on the expiration time of the recovered first data; and select the target storage area from the plurality of storage areas and store the at least a portion of the recovered first data in the target storage area according to the storage sequence.

16. The system according to claim 10, wherein the expiration time of any piece of the recovered first data is stored in metadata of a data slice corresponding to the any piece of the recovered first data, and the any piece of the recovered first data and the data slice corresponding to the any piece of the recovered first data are generated by performing erasure code encoding on raw data.

17. A non-transitory computer-readable medium, wherein the computer-readable medium stores computer program code, and when the computer program code is run on a computer, the computer is enabled to perform the method according to claim 1.

* * * * *